(12) United States Patent
Boerstler

(10) Patent No.: US 6,744,326 B2
(45) Date of Patent: Jun. 1, 2004

(54) INTERLEAVED VCO WITH BALANCED FEEDFORWARD

(75) Inventor: David William Boerstler, Round Rock, TX (US)

(73) Assignee: International Business Machines Corporation, Armonk, NY (US)

(*) Notice: Subject to any disclaimer, the term of this patent is extended or adjusted under 35 U.S.C. 154(b) by 12 days.

(21) Appl. No.: 10/268,289

(22) Filed: Oct. 10, 2002

(65) Prior Publication Data

US 2004/0070458 A1 Apr. 15, 2004

(51) Int. Cl.$^7$ .............................................. H03B 27/00
(52) U.S. Cl. ..................... 331/57; 331/177 R; 331/34; 331/16; 327/156; 327/157; 327/158; 327/159
(58) Field of Search ............................. 331/57, 117 R, 331/16, 34; 327/156, 157, 158, 159

(56) References Cited

U.S. PATENT DOCUMENTS

| | | |
|---|---|---|
| 4,105,950 A | 8/1978 | Dingwall |
| 5,475,344 A | 12/1995 | Maneatis et al. |
| 5,568,103 A | 10/1996 | Nakashima et al. |
| 5,757,240 A | 5/1998 | Boerstler et al. |
| 5,801,524 A | 9/1998 | Boerstler |
| 5,861,780 A | 1/1999 | Fukuda |
| 5,963,102 A | 10/1999 | Pang |
| 6,353,369 B1 | 3/2002 | Boerstler |

OTHER PUBLICATIONS

Related application U.S. Ser. No. 09/726,282 to Boerstler, filed Nov. 30, 2000, published May 30, 2002. (US 6,559,727).
Related applications U.S. Ser. No. 09/974,969 to Boerstler, filed Oct. 11, 2001.
Related application U.S. Ser. No. 09/974,986 to Boerstler, filed Oct. 11, 2001. (U.S. 6,529,084).

*Primary Examiner*—Arnold Kinkead
(74) *Attorney, Agent, or Firm*—Carr LLP; Robert M. Carwell

(57) ABSTRACT

An oscillator system is provided to have a plurality of delay paths coupled in a loop. The oscillator system also has an improved AC feedforward path coupled in parallel with one or more delay paths in the loop. The AC feedforward path includes first and second parallel sections. The first parallel section has a plurality of parallel branches and is configured for receiving one or more control signals. The plurality of parallel branches is selectively conducted in response to the one or more control signals. The second parallel section is coupled in series with the first parallel section and is configured to remain conducting when any of the plurality of parallel branches becomes conducting. The first and second parallel sections are configured to transmit an AC feedforward signal when conducting.

26 Claims, 5 Drawing Sheets

US 6,744,326 B2

INTERLEAVED VCO WITH BALANCED FEEDFORWARD

BACKGROUND OF THE INVENTION

1. Field of the Invention

The present invention relates generally to phase-locked loops (PLLs) and voltage-controlled oscillators (VCOs) used in the PLLs, and more particularly, to a balanced interleaved feedforward VCO (BIFFVCO).

2. Description of the Related Art

High-frequency voltage-controlled oscillators (VCOs) are extremely important for applications such as processor clock generation and/or distribution, wired and/or wireless communication, system synchronization, and frequency synthesis. Research on VCos for the past decade has been concentrated in the areas of high frequency, lower jitter, lower operating voltage and power, and increasing the frequency tuning range. Many of these design goals are achieved only at the expense of some or all of the other performance objectives. As technology progresses toward shorter channel lengths and lower operating voltages, the headroom available for an analog design decreases to the point that cascading (stacking) is no longer feasible. High-frequency analog VCOs operating with properly biased current sources may have signal swings that are only a small fraction of the supply voltage, severely limiting their usefulness.

Current-starved ring-oscillators using 3 or 4 levels of stacking have become quite common, but they have extreme sensitivity to noise due to very high gain, are inherently nonlinear (especially near cutoff, where they often stop oscillating), are inherently limited to 2X max frequency range and are difficult to build in less than 4 levels. Multiphase oscillators offer advantages by pipelining operations using equally spaced phases at lower frequencies, but control mechanisms in delay interpolators introduce offsets from the ideal spacing. LC-based oscillators are capable of high frequency and extremely low jitter but are difficult to integrate and model and have tuning ranges of only a few percent.

Therefore, there is a need for a VCO that creates a frequency dither that is symmetric about a DC operating point and that interfaces directly to a common phase-frequency detector, resulting in more optimal PLL performance.

SUMMARY OF THE INVENTION

The present invention provides an oscillator system, which has a plurality of delay paths coupled in a loop. The oscillator system also has an AC feedforward path coupled in parallel with one or more delay paths in the loop. The AC feedforward path includes first and second parallel sections. The first parallel section has a plurality of parallel branches and is configured for receiving one or more control signals. The plurality of parallel branches is selectively conducted in response to the one or more control signals.

The second parallel section is coupled in series with the first parallel section and is configured to remain conducting when any of the plurality of parallel branches becomes conducting. The first and second parallel sections are configured to transmit an AC feedforward signal when conducting.

BRIEF DESCRIPTION OF THE DRAWINGS

For a more complete understanding of the present invention, and the advantages thereof, reference is now made to the following description taken in conjunction with the accompanying drawings, in which.

DETAILED DESCRIPTION

In the following discussion, numerous specific details are set forth to provide a thorough understanding of the present invention. However, it will be obvious to those skilled in the art that the present invention may be practiced without such specific details. In other instances, well-known elements have been illustrated in schematic or block diagram form in order not to obscure the present invention in unnecessary detail.

Figure 1:
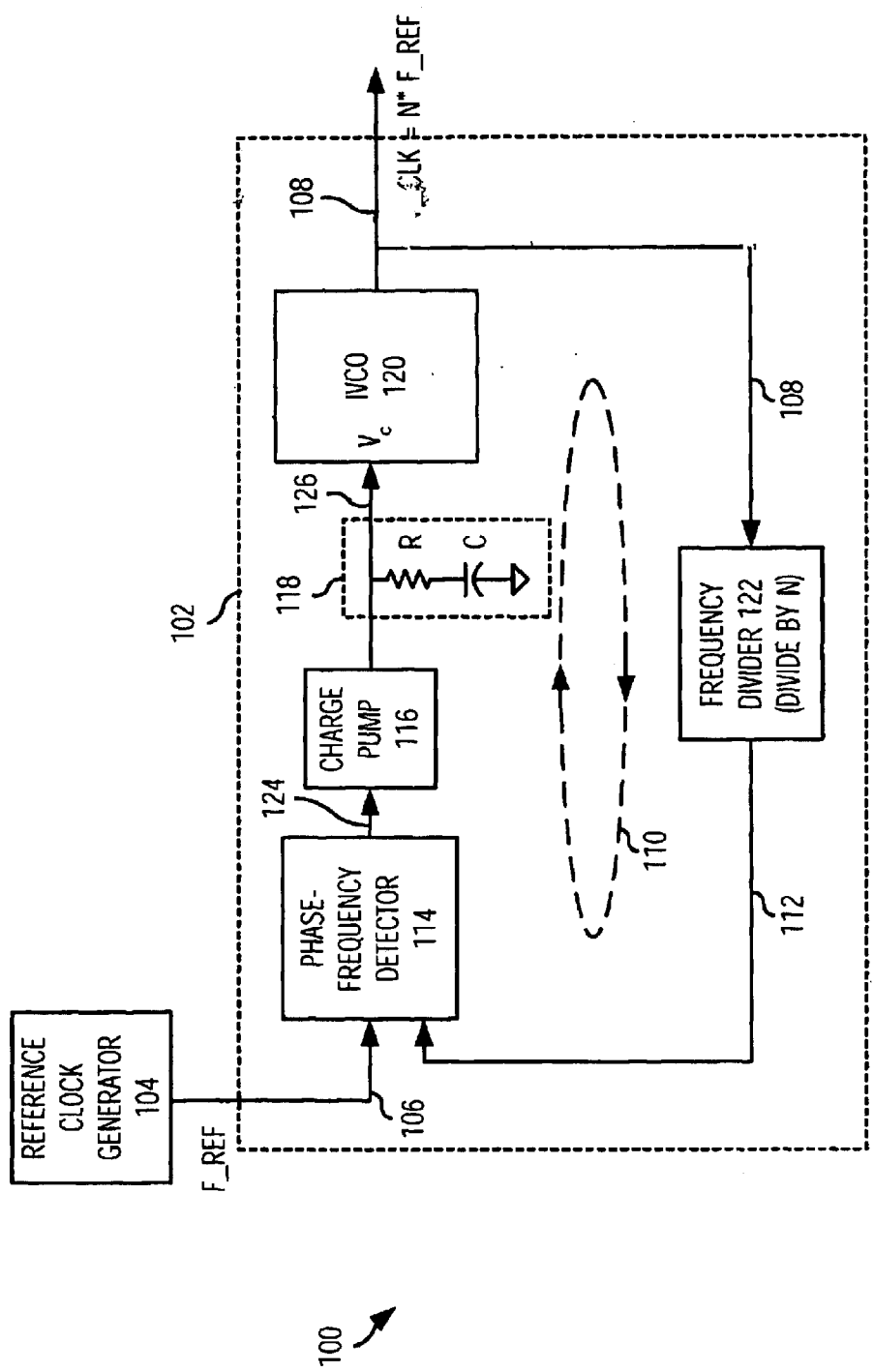
FIG. 1 is a block diagram of a prior-art phase-locked loop.

Referring to FIG. 1 of the drawings, the reference numeral 100 generally designates a block diagram incorporating a phase-locked loop (PLL) 102. The PLL 102 is coupled to a reference clock generator 104 to receive a reference clock signal 106 having frequency F_REF and is configured to generate a PLL output signal 108 having frequency F_CLK. Generally, the PLL 102 uses a feedback loop 110 to lock a feedback signal 112 to the reference clock signal 106.

Specifically, the feedback loop 110 includes a phase-frequency detector 114, a charge pump 116, a loop filter 118, an interleaved voltage-controlled oscillator (IVCO) 120, and optionally a frequency divider 122.

In the PLL 102, the phase-frequency detector 114 compares the reference clock signal 106 and the feedback signal 112 and generates an error signal 124, which is proportional to the magnitude of the phase/frequency difference between the reference clock signal 106 and the feedback signal 112. The error signal 124 is fed to the charge pump 116. The charge pump 116 controls the magnitude of charge stored in the loop filter 118 using current, thereby converting the error signal 124 into a control voltage input $V_c$ 126, which is recognizable by the IVCO 120. For example, the loop filter 118 contains a series RC combination. The series RC combination produces a second order system. The IVCO 120 generates the PLL output signal 108. Typically, the frequency F_CLK of the PLL output signal 108 is proportional to the control voltage input 126.

Optionally, the frequency divider 122 further divides down the frequency F_CLK of the PLL output signal 108 before the PLL output signal 108 is fed back to the phase-frequency detector 122. Provided that the frequency divider 122 is used in the PLL 102, the frequency of the PLL output signal 108 is higher than that of the feedback signal 112 by a factor of the frequency divider 122. For example, if the frequency divider 122 with a factor of N is used, the frequency of the PLL output signal 108 is approximately N times that of the feedback signal 112. Therefore, F_CLK= N*F_REF, wherein N is a positive integer. This is because the PLL 102 locks the frequency of the feedback signal 112 to the frequency F_REF of the reference clock signal 106 in the feedback loop 110.

Figure 2:
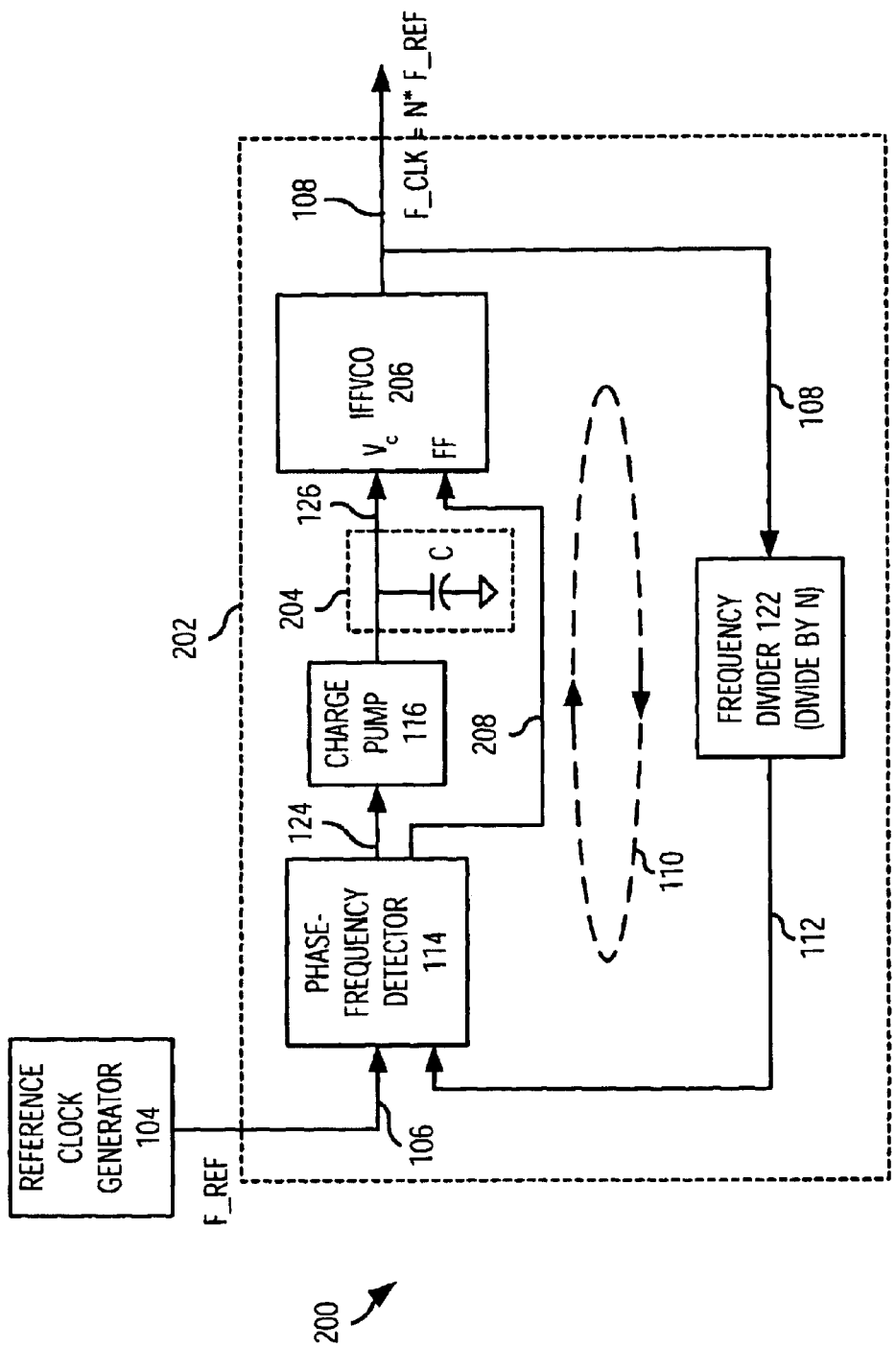
FIG. 2 is a block diagram of a prior-art phase-locked loop in which a balanced interleaved feedforward voltage-controlled oscillator (BIFFVCO)

Now referring to FIG. 2, a block diagram 200 includes an interleaved feedforward PLL (IFFPLL) 202. The IFFPLL 200 includes the same components as those in the PLL 100 of FIG. 1, except for a loop filter 204, an interleaved feedforward VCO (IFFVCO) 206, and one or more control signals 208.

The loop filter 204 has only capacitance C. The IFFVCO 206 has a feedforward input port FF for receiving the one or more control signals 208 from the phase-frequency detector 114. Preferably, the one or more control signals 208 include UP and DN signals (not shown) to increase and decrease the output frequency of the IFFPLL 202.

Figure 3:
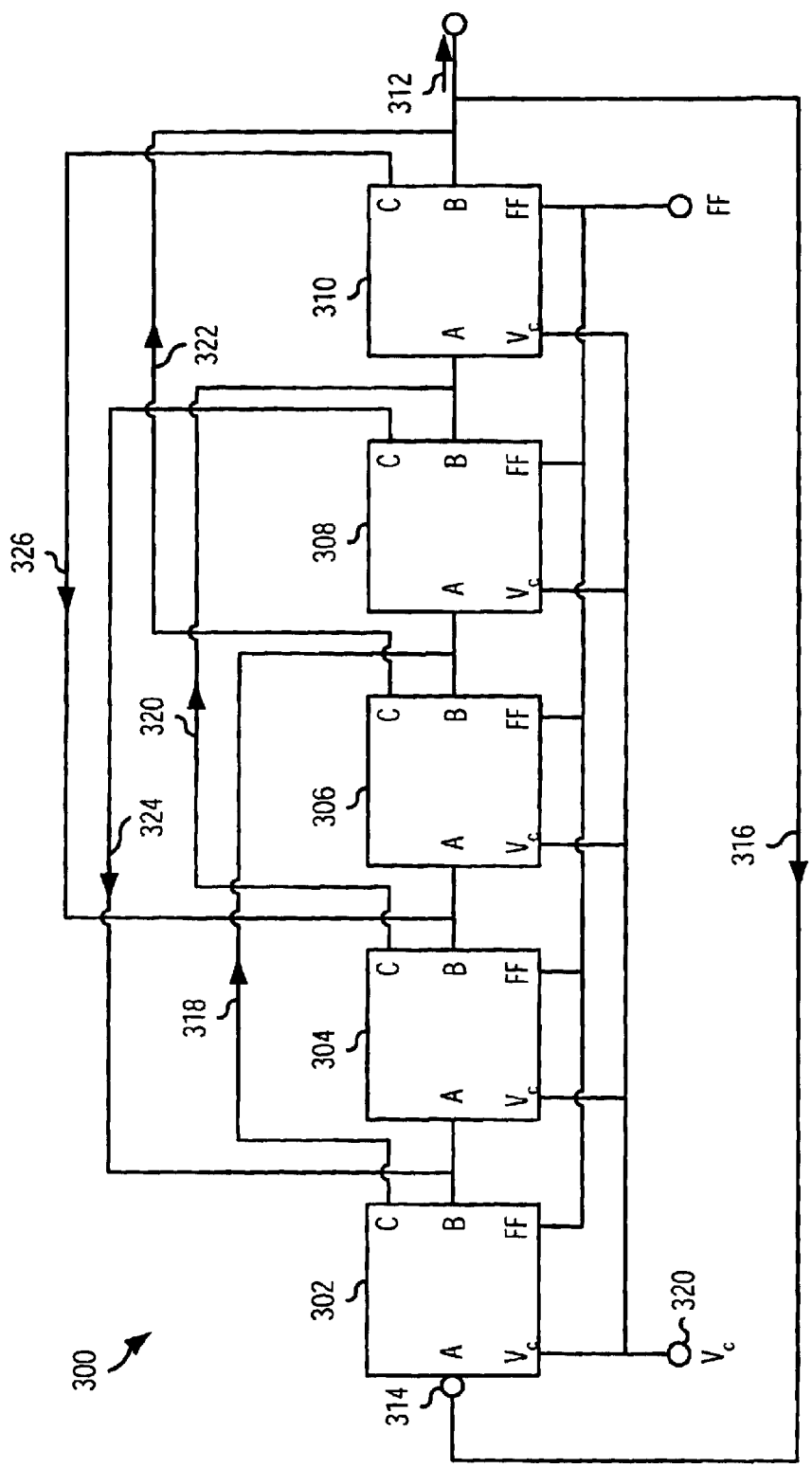
FIG. 3 is a block diagram of a prior-art five-stage oscillator.

FIG. 3 shows a block diagram of a five-stage interleaved feedforward VCO (IFFVCO) 300. The five-stage IFFVCO 300 is an example of the IFFVCO 206 of FIG. 2. The five-stage IFFVCO 300 comprises five delay elements (DEs) 302, 304, 306, 308, and 310 connected in a ring, with signal output 312 being fed back into input 314 of the DE 302 through a feedback connection 316.

Each DE contains a feedforward path (not shown) and a delay path (not shown), as explained below in reference to FIG. 4. Each feedforward path is coupled to an A input port of a different DE through a feedforward connection. Specifically, a feedforward connection 318 couples an output port C of the DE 302 to an input port A of the DE 308. Similarly, a feedforward connection 320 couples an output port C of the DE 304 to an input port A of the DE 310. Likewise, a feedforward connection 322 couples an output port C of the DE 306 to an input port A of the DE 312. Other feedforward connections 324 and 326 are configured in a similar fashion as clearly shown in FIG. 3.

Note that, although each DE in FIG. 3 contains both a delay path and a feedforward path, these paths do not have to reside in the same unit such as a DE.

Figure 4:
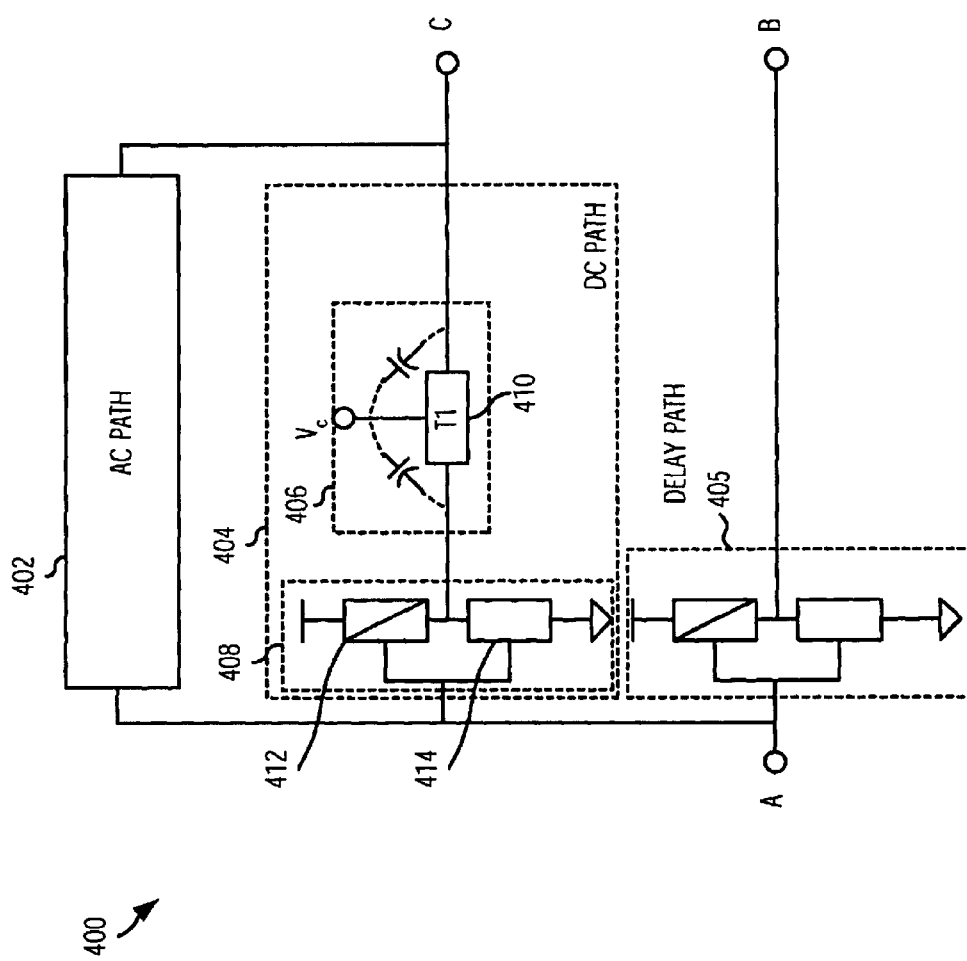
FIG. 4 is a schematic diagram of a prior-art delay stage in accordance with the oscillator type described in FIG. 3.

FIG. 4 shows a schematic diagram of a delay element 400 in accordance with the oscillator type described in FIG. 3.

The delay element 400 comprises an AC path 402, a DC path 404, and a delay path 405. For example, the components on the AC path 402 may be selected to exhibit low capacitance for high-frequency operation and need low driver impedance, while the components on the DC path 404 are less critical since the large capacitor on Vc integrates the parasitic currents for low sensitivity to parasitic noise currents and large capacitance, which aids in setting the DC operating point and which aids in integrating or smoothing the effect of noise currents.

The DC path 404 comprises an inverter 408 and a gate 410. The gate 410 can be either a transmission gate or a pass gate. Preferably, one or more Metal-Oxide Semiconductor Field-Effect Transistors (MOSFETs or MOSs) such as 410, 412, and 414 are used either alone or in combination to function as an inverter, transmission gate, or pass gate. Typically, a transmission gate comprises a single PMOS or NMOS transistor, whereas a pass gate comprises a complementary device including a pair of PMOS and NMOS transistors. Note that a gate in the present description can be either a transmission gate or a pass gate. Similarly, the delay path 405 comprises an inverter similar to the inverter 408.

The AC path 402 and DC path 404 together forms a feedforward path, which is coupled via a feedforward connection to another delay element in a ring oscillator such as the IFFVCO 300 as shown in FIG. 3.

Figure 5:
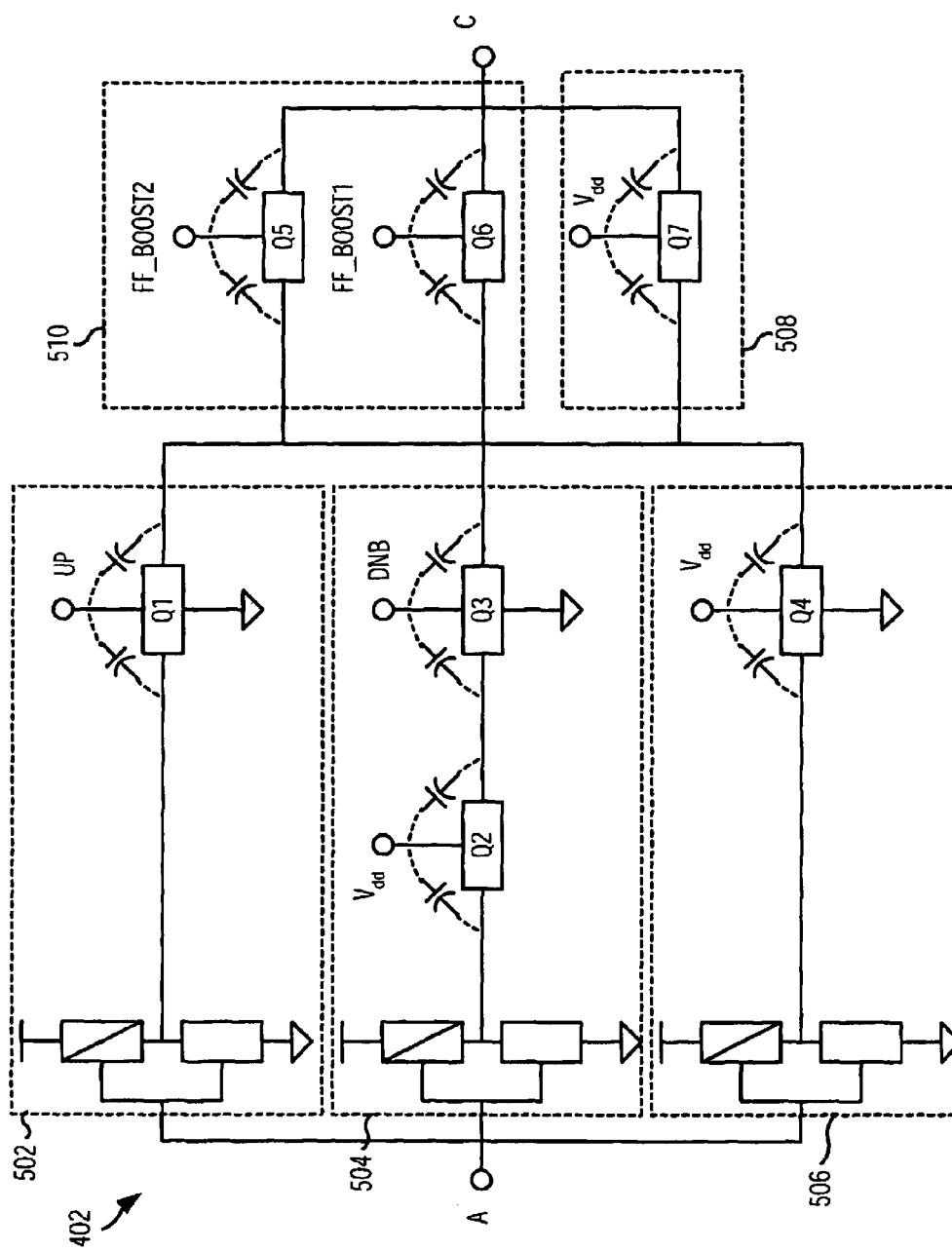
FIG. 5 is a schematic diagram of an AC path element used in the delay stage of FIG. 4.

Now referring to FIG. 5, the AC path 402 of the delay stage 400 of FIG. 4 is shown. The AC path 402 largely comprises a first branch 502, second branch 504, third branch 506, fourth branch 508, and fifth branch 510. The first, second, and third branches 502, 504, and 506 are parallel branches coupled in series with the parallel combination of fourth branch 508 and fifth branch 510 to connect node A and C. The first branch 502 includes gate Q1 controlled by an UP signal. The second branch 504 includes gates Q2 and Q3 respectively controlled by Vdd (bias voltage) and a DNB signal. The third branch 506 includes gate Q4 controlled by Vdd. The fourth branch 508 includes gate Q7, which is controlled by Vdd. Finally, the fifth branch 510 includes gates Q5 and Q6 respectively controlled by FF_boost2 and FF_boost1 signals. As mentioned above, gates Q1–Q7 each can be either a transmission gate or a pass gate.

Since gates Q4 and Q7 are always conducting, signals UP and DNB determine how many branch(es) in addition to the third branch 506 will be activated.

Signals UP and DNB are supplied by a phase-frequency detector, which supplies a pulse of width proportional to the phase error. Signal UP is asserted to increase frequency, whereas signal DN is asserted to decrease frequency. DNB is an inversion of DN. For PLL configurations that require a larger feedforward current, signals FF_BOOST1 and FF_BOOST2 may be individually or together asserted to increase the effective gain of the AC path 402 since the fifth branch 510 containing gates Q5 and Q6 is in parallel with the fourth branch 508. Signals FF_boost1 and FF_boost2 are configured at power-on to provide the feedforward gain that is appropriate for the PLL application. The AC impedance of signals UP, DN, FF_boost1, FF_boost2, and Vdd are designed to be small so that the parasitic elements have little effect on operating frequency. The PFD has 3 possible states: (1) UP asserted, (2) DN asserted, and (3) neither UP nor DN asserted.

Ignoring the FF_boost signals for the sake of simplicity, when UP is asserted, gates Q1, Q2, Q3, Q4, and Q7 are conducting. This activates all three branches, namely, the first, second, and third branches 502, 504, and 506 for maximum gain through the AC path 402. When signal DN is asserted, only gates Q4 and Q7 will conduct, providing the minimum gain through the AC path 402 by activating only one branch, namely, the third branch 506. When neither UP nor DN is asserted, gates Q2, Q3, Q4, and Q7 are conducting. In this case, two branches, namely, the second branch 504 and the third branch 506 are activated, and the gain should be at a level centered between the minimum and maximum levels. Gate Q2 is cascaded with gate Q3 to help attenuate the second branch 504 to maintain balance. For a Silicon On Insulator (SOI) process, gates Q1, Q3, and Q4 are body-contacted to reduce the history effect as well as attenuate the signal, while the remaining gates are arranged to be insensitive to history effects.

It will be understood from the foregoing description that various modifications and changes may be made in the preferred embodiment of the present invention without departing from its true spirit. This description is intended for purposes of illustration only and should not be construed in a limiting sense. The scope of this invention should be limited only by the language of the following claims.

What is claimed is:

1. An oscillator system having a plurality of delay paths coupled in a loop and an AC feedforward path coupled in parallel with one or more delay paths in the loop, the AC feedforward path comprising:

a first parallel section having a plurality of parallel branches and configured for receiving one or more control signals, wherein the plurality of parallel branches is selectively conducted in response to the one or more control signals; and a second parallel section coupled in series with the first parallel section and configured to remain conducting when any of the plurality of parallel branches becomes conducting, wherein the first and second parallel sections are configured to transmit an AC feedforward signal when conducting.

2. The oscillator system of claim 1, wherein the first parallel section comprises first, second, and third parallel branches each with a respective first, second, and third gate, and wherein the second parallel section comprises a fourth parallel branch with a fourth gate.

3. The oscillator system of claim 2, wherein the one or more control signals includes first and second control signals to increase and decrease frequency, respectively.

4. The oscillator system of claim 3, wherein the first, second, and third branches are configured to conduct when the first control signal is asserted.

5. The oscillator system of claim 3, wherein only the third branch in the first parallel section is configured to conduct when an inverted signal of the second control signal is asserted.

6. The oscillator system of claim 3, wherein only the second and third branches in the first parallel section are configured to conduct when neither the first nor the inverted version of the second control signal is asserted.

7. The oscillator system of claim 2, wherein the second parallel branch further comprises a gate coupled in series with the second gate, and wherein the gate is configured to conduct when the second gate is conducting.

8. The oscillator system of claim 2, wherein each of the first, second, and third parallel branches comprises an inverter.

9. The oscillator system of claim 2, wherein the second parallel section further comprises fifth and sixth parallel branches each with a respective fifth and sixth gate.

10. The oscillator system of claim 1, further comprising a DC feedforward path coupled in parallel with the AC feedforward path, the DC feedforward path comprising an inverter and another gate coupled in series to the inverter.

11. The oscillator of claim 2, wherein the first, second, third, and fourth gates each include a transistor.

12. The oscillator of claim 2, wherein the first, second, third, and fourth gates each comprise at least one transistor.

13. The oscillator of claim 2, wherein the first, second, third, and fourth gates each comprise a transmission gate.

14. The oscillator of claim 13, wherein the transmission gate comprises complementary transistor devices having a PMOS transistor and an NMOS transistor.

15. The oscillator of claim 2, wherein the first, second, third, and fourth gates each comprise a pass gate.

16. The oscillator of claim 15, wherein the pass gate comprises a single MOS transistor.

17. The oscillator of claim 2, further comprising fifth and sixth parallel branches coupled in parallel with the fourth parallel branch each with a respective fifth and sixth gate.

18. The oscillator of claim 17, wherein the fourth and fifth gates each comprise at least one transistor.

19. The oscillator of claim 17, wherein the fourth and fifth gates each comprise a transmission gate.

20. The oscillator of claim 19, wherein the transmission gate comprises complementary transistor devices having a PMOS transistor and an NMOS transistor.

21. The oscillator of claim 17, wherein the fifth and sixth gates each comprise a pass gate.

22. The oscillator of claim 21, wherein the pass gate comprises a single MOS transistor.

23. The oscillator of claim 17, wherein the fifth and sixth gates are configured to provide a sufficient feedforward gain at power-on.

24. An oscillator system comprising:
a plurality of delay paths including at least first and second delay paths, wherein the plurality of delay paths are connected to form a loop so as to sustain oscillation in the loop; and
at least one feedforward path coupled in parallel with one or more delay paths for receiving an output signal of the first delay path and outputting a feedforward signal to the second delay path, wherein the loop contains the one or more delay paths coupled between the first and second delay paths,
wherein the at least one feedforward path comprises an AC path comprising:
a first parallel section having a plurality of parallel branches and configured for receiving one or more control signals, wherein the plurality of parallel branches is selectively conducted in response to the one or more control signals; and
a second parallel section coupled in series with the first parallel section and configured to remain conducting when any of the plurality of parallel branches becomes conducting, wherein the first and second parallel sections are configured to transmit an AC feedforward signal when conducting.

25. A phase-locked loop comprising:
a phase-frequency detector generating an error signal and one or more control signals;
a charge pump coupled to the phase-frequency detector for receiving the error signal;
a loop filter coupled to the charge pump and configured for generating a voltage output Vc;
a voltage-controlled oscillator coupled to the phase-frequency detector and the loop filter for receiving the one or more control signals and the voltage output Vc,
wherein the voltage controlled oscillator has a plurality of delay paths coupled in a loop and an AC feedforward path coupled in parallel with one or more delay paths in the loop, the AC feedforward path comprising:
a first parallel section having a plurality of parallel branches, wherein the plurality of parallel branches is selectively conducted in response to the one or more control signals; and
a second parallel section coupled in series with the first parallel section and configured to remain conducting when any of the plurality of parallel branches becomes conducting, wherein the first and second parallel sections are configured to transmit an AC feedforward signal when conducting.

26. The phase-locked loop of claim 25, further comprising a frequency divider coupled to the voltage-controlled oscillator for receiving an output signal of the voltage-controlled oscillator and coupled to the phase-frequency detector for providing a feedback signal to the phase-frequency detector.

* * * * *